United States Patent [19]

Pawlowski et al.

[11] Patent Number: 4,828,959

[45] Date of Patent: May 9, 1989

[54] LIGHT-SENSITIVE DIAZONIUM RESIN MIXTURE AND LIGHT-SENSITIVE DIAZONIUM RESIN CONTAINING RECORDING MATERIAL WITH ORGANIC PEROXIDE COMPOUND

[75] Inventors: Georg Pawlowski, Wiesbaden; Dieter Mohr, Schlangenbad; Guenter Jung, Taunusstein, all of Fed. Rep. of Germany

[73] Assignee: Hoechst Aktiengesellschaft, Fed. Rep. of Germany

[21] Appl. No.: 53,011

[22] Filed: May 22, 1987

[30] Foreign Application Priority Data

May 24, 1986 [DE] Fed. Rep. of Germany ....... 3617499

[51] Int. Cl.$^4$ ................................. G03C 1/60
[52] U.S. Cl. ................................... 430/175; 430/176; 430/177; 430/302; 430/309; 430/330
[58] Field of Search ............... 430/175, 176, 191, 192, 430/177

[56] References Cited

U.S. PATENT DOCUMENTS

| | | | |
|---|---|---|---|
| 3,544,320 | 12/1970 | Yamada et al. | 96/48 |
| 3,660,097 | 5/1972 | Mainthia | 430/175 |
| 3,867,147 | 2/1975 | Teuscher | 430/175 |
| 4,259,430 | 3/1981 | Kaplan et al. | 430/191 |
| 4,289,838 | 9/1981 | Rowe et al. | 430/176 |
| 4,387,151 | 6/1983 | Bosse | 430/175 |
| 4,564,580 | 1/1986 | Ichimura et al. | 430/175 |
| 4,631,245 | 12/1986 | Pawlowski et al. | 43/175 |
| 4,659,645 | 4/1987 | Frommeld et al. | 430/175 |
| 4,749,639 | 7/1988 | Frommeld | 430/175 |

FOREIGN PATENT DOCUMENTS

| | | | |
|---|---|---|---|
| 565734 | 9/1987 | Australia | 430/192 |
| 1024803 | 1/1978 | Canada | 430/192 |
| 1172492 | 8/1984 | Canada | 430/175 |
| 2133899A | 8/1984 | United Kingdom . | |

OTHER PUBLICATIONS

G. T. Elie et al., *IBM Technical Disclosure Bulletin*, "Photoresist Cross-Linked with a Thermal Free-Radical Initiator for use as an Ion Implant Mask", vol. 17, No. 1, Jun. 1974, p. 85.

J. M. Mayone, *IBM Technical Disclosure Bulletin*, "Vacuum Bake Photoresist Preparation for High-Energy, High-Dose Ion Implantation", vol. 18, No. 3, Aug. 1975, pp. 788.

*Primary Examiner*—Charles L. Bowers, Jr.
*Attorney, Agent, or Firm*—Foley & Lardner, Schwartz, Jeffery, Schwaab, Mack, Blumenthal, & Evans

[57] ABSTRACT

A light-sensitive mixture that contains a diazonium salt polycondensation product, a polymeric binder and an organic peroxide which has a scorch temperature of at least 100° C. and, above this temperaure, is capable of forming free radicals is especially useful for the preparation of planographic printing plates, the print run of which can be extended by burning-in the exposed and developed plate. The light-sensitive mixture has a long storage life in the dark.

11 Claims, No Drawings

LIGHT-SENSITIVE DIAZONIUM RESIN MIXTURE AND LIGHT-SENSITIVE DIAZONIUM RESIN CONTAINING RECORDING MATERIAL WITH ORGANIC PEROXIDE COMPOUND

BACKGROUND OF THE INVENTION

The present invention relates to a light-sensitive mixture that contains a diazonium salt polycondensation product, a particular type of crosslinking compound and a polymeric binder, which mixture is especially suitable for the preparation of printing plates.

German Offenlegungsschrift No. 2,024,244 (corresponding to U.S. Pat. No. 3,867,147) has disclosed the use, for the preparation of printing plates, of light-sensitive recording materials comprising mixed condensation products of diazonium salts capable of condensation and other non-light-sensitive compounds capable of condensation, if appropriate in combination with polymeric binders. These light-sensitive materials are distinguished by a high light-sensitivity and long print runs. The run is particularly long when waterinsoluble binders, such as polyvinyl formal, are used. But such layers can be cleanly processed only with those developers that contain a considerable proportion of volatile organic solvents.

German Offenlegungsschrift No. 3,130,987 has disclosed similar mixtures that contain styrene/maleic anhydride copolymers as the binder and that can be developed with purely aqueous alkaline solutions. As a rule, these binders have acid numbers far above 100. The printing plates obtained with these mixtures give shorter print runs, however, than those that contain binders insoluble in .aqueous alkali.

German Offenlegungsschrift No. 3,036,077 has disclosed corresponding mixtures that contain polymers with alkenylsulfonylurethane side groups as the binder. These mixtures can also be developed with purely aqueous solutions. When processed to give planographic printing plates, however, they give light-hardened layers characterized by an ink absorption that is not satisfactory and a length of print run that is again limited.

European Patent Application No. 152,819 describes similar mixtures that contain a diazonium salt polycondensation product and a polymeric reaction product obtained from a polymer containing hydroxyl groups and intramolecular anhydrides of polycarboxylic acids, preferably dicarboxylic acids. The recording materials prepared from these mixtures can also be developed with aqueous alkaline solutions and are distinguished by advantageous copying and printing properties, in particular by a long print run as compared with other planographic printing plates that can be developed under aqueous-alkaline conditions.

Since the aim in principle is always a further increase in the length of print runs, attempts have been made to increase the print run performance of planographic printing plates by additional processing measures. For example, German Offenlegungsschrift No. 1,447,992 describes a process for the preparation of offset printing forms of increased print run performance, wherein the exposed and developed printing form is reheated for a certain period, such as for 20 minutes to 240° C. This effect is restricted to those layers containing novolaks as the binder. A significant improvement is obtained, moreover, only with positive-working layers based on naphthoquinone-diazides.

German Offenlegungsschrift No. 3,246,037 describes light-sensitive mixtures that contain various positive- or negative-working light-sensitive compounds, alkali-soluble binders and a crosslinking agent which can bbe activated thermally. The crosslinking agent used is, for example, hexamethylolmelamine and its methyl ethers Diazonium salt polycondensation products are also mentioned as light-sensitive, negative-working compounds. Here again, the best effect is obtained with positive-working mixtures, and the storage life of the mixtures is limited.

SUMMARY OF THE INVENTION

It is therefore an object of the present invention to provide a light-sensitive mixture, based on negative-working diazonium salt polycondensation products and polymeric binders, that can be processed to give planographic printing plates, the print run of which is extended substantially by heating or burning-in after developing, and the storage life of which is not shortened as compared with plates prepared with known mixtures of the same type.

It is also an object of the present invention to provide a light-sensitive recording material characterized by long print runs and, even under adverse storage conditions, enhanced stability.

It is yet another object of the present invention to provide a process for the preparation of planographic printing forms, which process entails the heating of a light-sensitive layer for a shortened period of time, and at reduced temperatures, compared to conventional printing-form manufacturing processes.

In accomplishing the foregoing objects, there has been provided, in accordance with one aspect of the present invention, a light-sensitive mixture comprising a diazonium salt polycondensation product, a polymeric binder and a crosslinking compound which can be activated thermally, wherein the crosslinking compound is an organic peroxide that has a scorch termperature of at least 100° C. and, above the scorch temperature, is capable of forming free radicals. In one preferred embodiment, the organic peroxide used in the light-sensitive mixture is a compound represented by one of the following formulas:

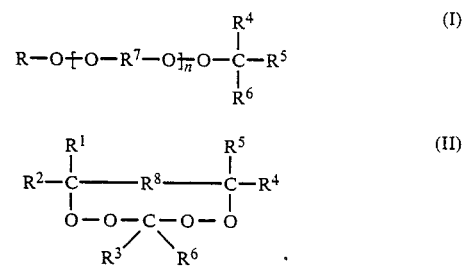

in which

R is an acyl group or a group

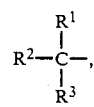

$R^1$ to $R^6$ are identical or different alkyl, alkenyl, cycloalkyl, aralkyl or aryl radicals, $R^7$ is an alkylene, cycloalkylene, alkenylene, alkynylene, aralkylene or arylene group,
$R^8$ is a single bond or an alkylene group and
n is 0 or 1.

There has also been provided, in accordance with another aspect of the present invention, a light-sensitive recording material comprised of a support and a light-sensitive layer applied to the support, which layer comprises the above-described light-sensitive mixture.

In accordance with still another aspect of the present invention, there has been provided a process for the preparation of planographic printing forms, comprising the steps of image-wise exposing a light-sensitive recording material as described in the preceding paragraph; then developing the exposed recording material; and, thereafter, heating the developed recording material to a temperature above 120° C. for a period of time such that crosslinking in the light-sensitive layer of the recording material is effected Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

The process according to the present invention comprises the steps of using a recording material of the nature and composition described above, and of heating the developed material for a short period to a temperature above 120° C. Suitable peroxides to be used in this context include, in particular, commercially available peroxy esters, peroxy ketals, bis-aralkyl peroxides, dialkyl peroxides, bis-dialkyl peroxides and bis-peroxy esters. These peroxides should in general be of such a nature that their scorch temperature, i.e., the temperature at which measurable crosslinking takes place, is at least 120° C. If this is the case, the peroxides in question have an adequate activity when the developed printing plate is heated to a temperature in the range of about 160°–200° C.

In some cases, however, compounds can also be used that have a scorch temperature markedly below 120° C., for example, 100° C. Preferably, peroxides are used that have a scorch temperature in the range from about 120° to 150° C., although compounds having scorch temperatures of 160° C. and higher can be used in many cases. The preferred peroxides should have crosslinking times($t_{90}$) of more than 60 minutes at 120° C., i.e., 90% crosslinking at this temperature takes longer than 60 minutes. In particular, the preferred peroxides have $t_{90}$ values of 1.5 to 25 minutes at 180° C. and of 0.5 to 4 minutes at 210° C.

Those peroxides are particularly preferred that are represented by one of the following formulas:

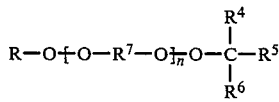
(I)

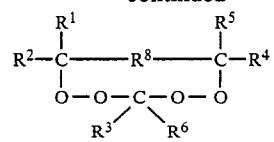
(II)

in which
R is an acyl group or a group

$R^1$ to $R^6$ are identical or different alkyl, alkenyl, cycloalkyl, aralkyl or aryl radicals, it being possible for any two alkyl radicals substituted on one carbon atom to be linked to form a cycloalkylene group,
$R^7$ is an alkylene, cycloalkylene, alkenylene, alkynylene, aralkylene or arylene group,
$R^8$ is a single bond or an alkylene group and
n is 0 or 1.

In formula (I), R is preferably a group represented by the formula $(R^1)(R^2)(R^3)C$; an acyl group R is preferably aromatic.

If $R^7$ is an aliphatic or cycloaliphatic group or an aralkylene group bonded via aliphatic carbon atoms, the carbon atoms linked to the peroxy groups are preferably tertiary.

If the radicals $R^1$ to $R^6$ are alkyl groups, they preferably have 1 to 4 carbon atoms, methyl groups being particularly preferred.

In each case, at least two of the radicals $R^1$ to $R^6$ are preferably alkyl groups that are substituted, respectively, on one carbon atom.

Alkenyl groups $R^1$ to $R^6$ preferably have 2 to 4 carbon atoms. Preferably, cycloalkenyl groups have 5 to 8 carbon atoms, aralkyl groups have 7 to 10 carbon atoms and aryl groups have 6 to 10 carbon atoms.

If $R^7$ is an alkylene group, this generally has 1 to 12 carbon atoms, preferably 3 to 12 carbon atoms. Alkenylene and alkynylene $R^7$ groups in general have 2 to 12 carbon atoms, preferably 4 to 12 carbon atoms. Cycloalkylene $R^7$ groups generally have 5 to 10 carbon atoms, while arylene groups have 6 to 10 carbon atoms and aralkylene groups have 7 to 12 carbon atoms.

$R^8$ generally has 1 to 8, preferably 2 to 4, carbon atoms.

The substituents R and $R^1$ to $R^6$, as well as the $R^7$ and $R^8$ groups, can be pure hydrocarbon groups, i.e., they can be unsubstituted or substituted by alkyl groups. They can also contain halogen atoms and alkoxy, acyl, acyloxy or alkoxycarbonyl groups as substituents.

Examples of preferred peroxides are:
1,1-bis-(t-butylperoxy)-trimethylcyclohexane,
n-butyl 4,4-bis-(t-butylperoxy)-valerate,
ethyl 3,3-bis-(t-butylperoxy)-butyrate,
dicumyl peroxide,
t-butylcumyl peroxide,
1,4-bis-(t-butylperoxyisopropyl)-benzene,
2,5-dimethylhexane-2,5-di-t-butyl peroxide,
di-t-butyl peroxide,
2,5-dimethylhex-3-yne-2,5-di-t-butyl peroxide,
and the corresponding amyl peroxides and, for special applications, also
t-butyl perbenzoate and hexamethyl-tetraoxacyclononane.

Many such peroxides are commercially available, generally in desensitized form, for example, as pastes in silicone oil or as a powder or granules in chalk mixtures or plastic mixtures. Their proportion in a mixture of the present invention is about 0.1 to 15% by weight, preferably 0.5 to 10% by weight, a pure, unstabilized, active substance being taken as the base and the proportion being related to the non-volatile constituents of the mixture.

Suitable diazonium salt polycondensation products are condensation products of aromatic diazonium salts, such as diphenylamine-4-diazonium salts, with aldehydes, preferably formaldehyde. With particular advantage, mixed condensation products are used that, in addition to the diazonium salt units, also contain other non-light-sensitive units derived from compounds capable of condensation, in particular aromatic amines, phenols, phenol ethers, aromatic thioethers, aromatic hydrocarbons, aromatic heterocyclic compounds and organic acid amides. These condensation products are described in German Offenlegungsschrift No. 2,024,244. In general, all diazonium salt polycondensation products descibed in German Offenlegungsschrift No. 2,739,774 are suitable The diazonium salt units A—N$_2$X are preferably derived from compounds represented by the formula $(R^{16}-R^{17}-)_p-R^{18}-N_2X$, wherein X is the anion of the diazonium compound, p is an integer from 1 to 3, $R^{16}$ is an aromatic radical having at least one position capable of condensation with an active carbonyl compound, $R^{18}$ is a substituted or unsubstituted phenylene group and $R^{17}$ is a single bond or one of the groups:
—(CH$_2$)$_q$—NR$^{19}$—,
—O—(CH$_2$)$_r$—NR$^{19}$—,
—S—(CH$_2$)$_r$—NR$^{19}$—,
—S—CH$_2$CO—NR$^{19}$—,
—O—R$^{20}$—O—,
—O—
—S— or
—CO—NR$^{19}$— where q is a number from 0 to 5, r is a number from 2 to 5, $R^{19}$ is hydrogen, an alkyl group having 1 to 5 carbon atoms, an aralkyl group with 7 to 12 carbon atoms or an aryl group having 6 to 12 carbon atoms and $R^{20}$ is an arylene group having 6 to 12 carbon atoms.

Among the classes of compounds mentioned above, the condensation products of diphenylamine-4-diazonium salts, which are unsubstituted or substituted by alkyl or alkoxy groups or halogen atoms, are preferred. As the second component B, substituted or unsubstituted diphenyl ethers, diphenyl sulfides, diphenylmethanes and diphenyls are preferred. The bis-methoxymethyl, bis-hydroxymethyl and bis-acetoxymethyl derivatives of the base compounds are used with particular advantage. The condensation product can on average contain 0.1 to 50 units, preferably 0.2 to 20 units, of B per unit of A—N$_2$X.

Other, particularly advantageous polycondensation products are obtained by condensing a substituted or unsubstituted diphenylaminediazonium salt first with an aromatic compound R'—O—CH$_2$—B and then with an aromatic compound R'—O—CH$_2$—B—CH$_2$—O—R', R' being a hydrogen atom or an alkyl or aliphatic acyl radical. These condensation products are described in European Application No. 126,875.

The mixtures according to the present invention in general contain 5% to 80% by weight, preferably 10% to 70% by weight, of diazonium compound.

Polymeric binders that are suitable for use in the present invention include essentially all the known polymers that contain a sufficient number of active hydrogen atoms which can be removed by a free radical mechanism and, in particular, which are bonded to tertiary carbon atoms; and that are compatible in the above-indicated concentration ratios with the diazonium salt polycondensation products previously described. Among these, binders that are soluble or at least swellable in aqueous alkaline solutions are preferred.

The following are exemplary of suitable polymers for the present invention: copolymers of styrene or substituted styrenes with unsaturated carboxylic acids, for example, copolymers of styrene with crotonic acid or maleic anhydride; partially saponified or partially esterified copolymers of styrene with maleic anhydride; copolymers of alkyl (meth)acrylates with unsaturated carboxylic acids, for example, terpolymers of hexyl methacrylate, methyl methacrylate and acrylic acid; copolymers of hydroxyalkyl (meth)acrylates with other unsaturated (meth)acrylates or with acrylonitrile; vinyl acetate copolymers; partially saponified vinyl acetate copolymers; copolymers of vinyl alcohol, allyl alcohol or higher unsaturated alcohols; polyvinyl acetals; epoxide resins with aliphatic units; partially saponified epoxide resins; polyurethanes; polyesters; polyethers and the like.

Reaction products of polymers containing hydroxyl groups, in particular polyvinyl acetals, such as polyvinyl butyrals, with sulfonyl isocyanates, phosphinyl isocyanates or dicarboxylic acid anhydrides, or mixtures thereof, are preferred. The polymeric reaction products, described in German Offenlegungsschrift No. 3,404,366, of a polymer containing hydroxyl groups and the anhydride of a cyclic dicarboxylic or tricarboxylic acid, in particular a dicarboxylic acid, are particularly preferred. Such preferred binders are obtained by reaction with acid anhydrides represented by one of the following formulas:

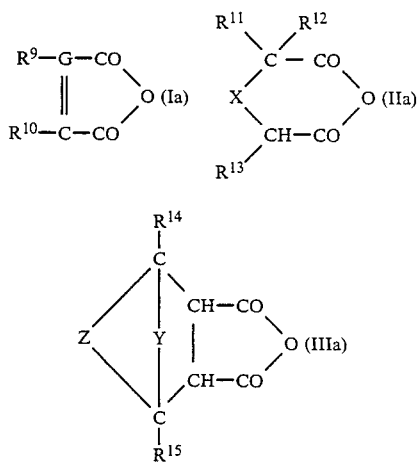

in which $R^9$ and $R^{10}$ are separately a hydrogen atom, a halogen atom or an alkyl group, or are together linked to form an aromatic or heteroaromatic, 5- or 6-membered ring which is substituted or unsubstituted and may be partially hydrogenated, and to which as many as two aromatic or cycloaliphatic rings can be fused, $R^{11}$, $R^{12}$ and $R^{13}$ are separately a hydrogen atom or an alkyl group, or $R^{11}$ and $R^{13}$ are together linked to form a substituted or unsubstituted, saturated or unsaturated aliphatic ring which can have 5 or 6 ring members including X, $R^{14}$ and $R^{15}$ are separately a hydrogen atom or an alkyl group, X is a single bond, a substituted or unsubstituted 1,1-alkylene or 1,1-cycloalkylene group, or an oxygen or sulfur atom, Y is an oxygen or sulfur atom, a 1,1- or a 1,2-alkylene group, or a 1,2-alkenylene group to which an aromatic or cycloaliphatic ring can be fused, and Z represents the ring members required for completing a saturated or unsaturated ring that can be substituted or unsubstituted, it being possible for up to two aromatic or cycloaliphatic rings to be fused to this ring.

If the radicals $R^9$ to $R^{15}$ are alkyl groups, these in general have 1 to 4 carbon atoms, preferably 1 or 2 carbon atoms.

Examples of substituents that can be bonded to the aromatic or cycloaliphatic rings are alkyl groups, alkoxy groups, halogen atoms, nitro groups and carboxyl groups.

The reaction products with maleic, chloromaleic, dichloromaleic, phthalic, trimellitic, succinic and 3-oxaglutaric anhydride are particularly preferred.

Synthetic polymers containing hydroxyl groups can especially be polymers with vinyl alcohol units, epoxide resins and saponified epoxide resins, copolymers of allyl alcohol or higher unsaturated alcohols, polyhydroxyalkyl acrylates and methacrylates, and similar polymers. Suitable polymers with vinyl alcohol units are partially saponified polyvinyl esters, polyvinyl acetals with free hydroxyl groups and corresponding reaction products of copolymers or copolymerized products with vinyl ester, vinyl acetal or vinyl alcohol units.

The molecular weight of the binders used in the present invention can vary within wide limits. In general, binders having mean molecular weights between 5,000 and about 200,000 and higher, preferably between 10,000 and 100,000, are employed. The acid number of the binders can in general be between 5 and 200, preferably between 15 and 100. The quantitative proportion of binder is in general between 20% and 95% by weight, and is preferably 25% to 85% by weight, relative to the nonvolatile constituents of the mixture.

For stabilizing a light-sensitive mixture within the present invention, it is advantageous to add a compound having an acidic character. These can be mineral acids and strong organic acids, among which phosphoric acid, sulfuric acid, perchloric acid, boric acid or p-toluenesulfonic acid are preferred. Phosphoric acid is a particularly suitable acid in this regard.

Plasticizers, wetting agents, levelling agents, adhesion promoters, dyes, pigments and color formers can also be added to the mixtures. The nature and quantity of these additives depend on the field of application envisaged for the light-sensitive mixture.

Within the scope of the present invention, the following distribution by weight of the most important additives in the light-sensitive mixture is preferred, relative to the content of non-volatile constituents, i.e., the constituents of the solid light-sensitive layer obtained after evaporation of the solvent:

| | |
|---|---|
| Binder | 30 to 90% |
| Diazonium salt polycondensation product | 10 to 70% |
| Peroxide | 0.5 to 10% |
| Acid | 0 to 10% |
| Dye or pigment | 0 to 12% |
| Exposure contrast improver (dye) | 0 to 5% |

In accordance with the present invention, a support material is coated from appropriate organic solvents or solvent mixtures, generally by casting, spraying or dipping. Suitable solvents are alcohols, ketones, esters, ethers and the like. The partial ethers of glycols or keto alcohols, such as ethylene glycol monomethyl ether, have here proved to be advantageous solvents.

Examples of suitable support materials are magnesium, zinc, copper, copper/chromium, brass/chromium, mechanically, chemically and electrochemically roughened aluminum, anodized aluminum, steel and chromium-plated steel, and also polyester and cellulose acetate film, nylon 6-gauze and the like, the surface of which can have been subjected to a pretreatment, if necessary. The support material can then function as a final support, or as a temporary support material from which a light-sensitive layer formed from a mixture within the present invention is transferred by lamination to the work piece which is to be worked.

Recording material prepared with the light-sensitive mixtures of the present invention is used, on the one hand, for the production of images on suitable supports or receiving sheets and, on the other hand, for the preparation of reliefs which are used as printing forms, screens, resists and the like. It is also possible to use the light-sensitive mixtures of the present invention for the preparation of coatings that can be cured by UV radiation and can be used as surface protection, or for the formulating of UV-curable printing inks.

With particular preference, a mixture of the present invention is used for the preparation of planographic printing forms, the preferred support material being aluminum. Aluminum that is pretreated in the conventional manner for this purpose, for example, by mechanical, chemical or electrochemical roughening and, if appropriate, subsequent anodic oxidation, is particularly preferred. A further treatment of this support material, for example, with polyvinylphosphonic acid, alkali metal silicate, phosphate, hexafluorozirconate, chromate, borate, polyacrylamide and/or cellulose derivatives, is advantageous.

The mixtures according to the present invention can also be used in the photoresist technique, for example, for the preparation of letterpress, gravure and multimetal printing plates and of printed circuits. In these applications, the enhanced resistance of the layer, compared with the otherwise used photopolymerizable mixtures, is advantageous in many cases. In particular, the resistance, which is markedly enhanced after thermal recuring, as to solvents, to solvent-containing inks and, if the binders have acidic functional groups, also to aqueous-alkaline or organic-alkaline fluids and reagents as well as those aqueous or alcoholic mixtures that contain wetting agents and/or organic or inorganic acids, manifests itself advantageously in all applications.

When the mixtures according to the present invention are used for planographic printing forms, there is also a markedly enhanced abrasion resistance which in some cases allows the life of the layer to be increased several times by post-baking; an increase of the abrasion resistance by a set value of at least two is observed in general. An advantage of the thermally curable mixture according to the present invention is that the increase in abrasion resistance as a function of the selected peroxide can be obtained at lower temperatures than was hitherto usual. One the other hand, the peroxides can be selected such that precrosslinking does not take place at room temperature or under the chosen processing conditions.

It was surprising in this regard that the mixtures of the present invention are thermally curable in the manner described, since crosslinking of layer constituents by peroxides, which are known as polymerization catalysts, was not to be expected, and even less so if the main constituents of the layer are saturated compounds. The peroxide-containing mixtures can be more effectively cured by heating than known mixtures where, for example, hexamethoxymethylmelamine is used as the crosslinking agent. Surprisingly, they also have a longer storage life at normal temperature than these known mixtures.

The recording materials obtained from the mixtures are processed in a conventional manner by imagewise exposure and washing-out of the unexposed layer areas with a suitable developer. The recording material, more particularly, is exposed in a known manner through an original, using copying light sources that emit the highest possible spectral proportion in the near ultraviolet range. Exposure can also be carried out by laser irradiation. Relatively short-wave lasers of appropriate power, such as Ar lasers, krypton ion lasers, helium/cadmium lasers which emit approximately between 300 and 600 nm, and, for some layers, $CO_2$ lasers which emit at 10.6 $\mu$m and YAG lasers which emit at 1.06 $\mu$m, are suitable for irradiation.

The developer solutions used in the present context are neutral or alkaline aqueous solutions having a pH in the range from 6 to 14, preferably 7.5 to 12, which contain buffer salts, for example, water-soluble alkali metal phosphates, silicates, borates, carbonates, acetates and benzoates. Wetting agents preferably anionic wetting agents, and water-soluble polymers, if appropriate, are used as additional constituents. The solution can also contain small quantities, for example, up to 5% and preferably not more than 2% by weight, of water-miscible organic solvents. Solvents of low volatility, like araliphatic alcohols, the vapor pressure of which is immaterial when the developer is handled, are preferred.

The development can be carried out in a known manner by dipping, spraying, brushing or dabbing.

The abrasion resistance of the printing plate developed in this way can be yet improved, according to the present invention, by thermal curing. For this purpose, the plate is heated preferably to a temperature between 120° and 240° C. It is an advantage if the plate is treated with a suitable burn-in gumming composition before this treatment, in order to avoid staining of the background. When peroxides of relatively low scorch temperature are used, however, gumming can be omitted since, in such cases, contamination due to condensing layer constituents is not to be expected. A particular advantage of the mixtures within the present invention is that burning-in can be carried out for a time which is greatly shortened, in general to 0.3 to 10 minutes, preferably to 0.5 to 5 minutes, and at markedly reduced crosslinking temperatures, generally between 120° and 240° C., preferably between 140° and 230° C. It is to be regarded as a further advantage of the present invention that those mixtures that, in fact, no longer contain any cross-linking or cross-linkable groups can also be cured by a heating step. Thus, even fully exposed diazonium salt polycondensation products can be further cross-linked in an inert binder, and their abrasion resistance thereby markedly improved.

The following examples describe the preparation of light-sensitive mixtures according to the present invention, and of recording materials prepared with these mixtures. In the examples, parts by weight (P.B.W.) and parts by volume (P.B.V.) are mutually related as g and ml. Unless otherwise stated, percentage data are % by weight, and temperatures are given in °C. All printing tests were carrried out with increased contact pressure of the machines and with the use of inks that promote abrasion.

EXAMPLE 1

A coating solution comprised of:
62 parts by weight of the reaction product of a polyvinyl butyral, which had a molecular weight of 70,000 to 80,000 and contained 71% by weight of vinyl butyral units, 2% by weight of vinyl alcohol units, and 27% by weight of vinyl alcohol units, with succinic anhydride (acid number of the product 42),
21 parts by weight of a diazonium salt polycondensation product prepared from 1 mol of 3-methoxy-diphenylamine-4-diazonium sulfate and 1 mol of 4,4'-bis-methoxymethyl-diphenyl ether in 85% phosphoric acid and isolated as the mesitylenesulfonate,
2.4 parts by weight of 45% 2,5-dimethylhexane-2,5-di-t-butyl peroxide as granules with chalk (INTEROX DHBP-45-IC/G, from Peroxid-Chemie GmbH),
2.5 parts by weight of phosphoric acid (85%),
3 parts by weight of Victoria pure blue FGA (C.I.Basic Blue 81),
0.7 parts by weight of phenylazodiphenylamine in
2570 parts by weight of 2-methoxy-ethanol, and
780 parts by weight of tetrahydrofuran
was applied to an aluminum foil which had been electrolytically roughened and anodized and then pretreated with a 0.1% aqueous solution of polyvinylphosphonic acid. After the coating solution thus applied was dried, a copying layer was obtained which had a layer weight of 1.1 g/m².

The copying layer was exposed under a negative original for 30 seconds with a metal halide lamp of 5 kW power. Another printing plate was prepared in the same way and similarly exposed.

The exposed layers were treated by means of a cotton pad with a developer solution of the following composition:
2.9 parts by weight of sodium octylsulfate,
0.2 parts by weight of sodium metasilicate×9 water,
3.5 parts by weight of trisodium phosphate×12 water,
3.9 parts by weight of disodium hydrogen phosphate×12 water and
1.5 parts by weight of potassium tetraborate×4 water in
88 parts by weight of water.

The unexposed layer areas were thereby cleanly removed within a few seconds. The layers were then rinsed with water and dried.

In the resulting copies, step 4 of a silver-film continous step wedge with a density range from 0.15 to 1.50, the density increments being 0.15, was still fully covered.

One of the two printing plates was stored for 5 minutes in a circulating-air oven heated to 200° C. and then allowed to cool. The two printing forms were then clamped side-by-side into a sheet offset press. Whereas the plate that had not been cured showed some damage in the screen areas and a poorer ink absorbtion in the full tone areas after about 140,000 prints, the burnt-in plate that had been thermally post-treated according to the present invention still produced perfect prints after a run of 260,00 prints.

EXAMPLE 2

A coating solution comprised of:
35.1 parts by weight of the reaction product of the polyvinyl butyral described in Example 1 with maleic anhydride (acid number of the product 30),
23.4 parts by weight of the diazonium salt condensation product indicated in Example 1, 2.0 parts by weight of di-t-butyl peroxide (INTEROX DTB, from Peroxid-Chemie GmbH) as a technically pure liquid,
2.1 parts by weight of phosphoric acid (85%),
1.5 parts by weight of Victoria pure blue FGA and
1.1 parts by weight of phenylazodiphenylamine in
1900 parts by weight of 2-methoxy-ethanol
was applied to an aluminum foil, which had been roughened by brushing with an aqueous abrasive suspension and then pretreated with a 0.1% aqueous solution of polyvinylphosphonic acid, to give a dry layer weight of 0.98 g/m$^2$ and was dried for 2 minutes at 100° C.

After imagewise exposure and development of two samples of this plate with the developer solution described in Example 1, copies of very high resolution and steep gradation were obtained. The developed plates were wiped with a commercially available burn-in gumming and dried. One plate was heated for 2 minutes to 210° C.

After clamping into a sheet offset press, about 35,000 sheets of perfect quality were obtained with the plate which had not been heated, and about 85,000 sheets of perfect quality were obtained with the heated plate.

EXAMPLE 3

A coating solution of the following composition
15.7 parts by weight of the reaction product of the polyvinyl butyral described in Example 1 and phthalic anhydride, having an acid number of 45,
15.7 parts by weight of the diazonium salt polycondensation product described in Example 1,
1.2 parts by weight of dicumyl peroxide (INTEROX DCUP-40-G from Peroxid-Chemie GmbH) as 40% granules with chalk,
1.0 part by weight of phosphoric acid (85%),
1.2 parts by weight of Renol blue B2G-H (C.I. 74,160), and
0.2 part by weight of phenylazodiphenylamine in
1200 parts by weight of 2-methoxy-ethanol
was applied to the support used in Example 1. Another plate was prepared in the same way, but with the dicumyl peroxide omitted.

Development was carried out with the developer indicated in Example 1. The copies thus obtained showed no difference with regard to tone value and light sensitivity, i.e., that the addition of peroxide had no influence on the copying properties of the printing plate.

After development, a sample of each of the two plates, differing by the peroxide addition, was heated for 5 minutes to 180° C.

Four printing plates which had been prepared or treated in different ways were clamped in, side-by-side, in the following order:
Plate a: comparison layer without peroxide, uncured,
Plate b: comparison layer without peroxide, thermally cured,
Plate c: layer according to the invention, thermally cured,
Plate d: layer according to the invention, uncured.

Print runs of about 125,000 prints were obtained with plates a and d, no clear difference being detectable in the printing properties. Plate b gave a printing run of about 180,000 prints. At this number, irregularities clearly appeared in the screen area. By contrast, plate c printed without any visible loss of quality until printing was stopped at 225,000 prints.

EXAMPLE 4

A storage test was carried out with the printing plates prepared, according to the present invention, in Example 3, with peroxide addition and the corresponding comparison plates without peroxide addition. For this purpose, 5 plates of each of the two types were prepared. Of each type, a sample development was first carried out after imagewise exposure. The two plates showed identical copying properties. The remaining plates were each stored for 1 to 4 hours in a heating cabinet at 100° C., allowed to cool, exposed imagewise and developed.

For the plates prepared in accordance with the present invention, the same development results as for the comparison plates were obtained in all cases. This means that the storage life of the printing plates of the present invention did not significantly deteriorate due to the peroxide addition and that those plates withstood higher temperatures for a prolonged period, under adverse storage conditions.

EXAMPLE 5

A coating solution was prepared from the following constituents:
30.3 parts by weight of the reaction product of the polyvinyl butyral as described in Example 1 and propylsulfonyl isocyanate, having an acid number of 132,
15.1 parts by weight of the diazonium salt polycondensation product described in Example 1,
1.5 parts by weight of 1,4-bis-(t-butylperoxyisopropyl)-benzene (INTEROX DIPP-2, from Peroxid-Chemie GmbH) as technically pure flakes,
1.2 parts by weight of phosphoric acid (85%),
1.1 parts by weight of phenylazodiphenylamine, and
1.5 parts by weight of Victoria pure blue FGA in
1600 parts by weight of 2-methoxy-ethanol.

After coating, drying and exposure, processing was carried out with a developer of the following composition:
5 parts by weight of sodium laurylsulfate,
3 parts by weight of sodium metasilicate×5 H$_2$O,
92 parts by weight of water.

One of the printing plates obtained was heated for 5 minutes to 180° C. and then was used for printing in a press next to an uncured printing plate with the same light-sensitive composition. The printing ink used was a commercially available UV-curable ink. With the printing plate which had not been heated, a maximum of about 56,000 prints was obtained, whereas the printing plate according to the present invention showed no damage whatsoever at the 56,000-print mark.

EXAMPLE 6

A coating solution comprised of:
- 35.1 parts by weight of the reaction product of a polyvinyl butyral having a molecular weight of about 70,000 to 80,000 and containing 86% by weight of vinyl butyral units, 2% by weight of vinyl acetate units and 12% by weight of vinyl alcohol units, with 3-oxaglutaric anhydride (acid number 43),
- 23.4 parts by weight of a diazonium salt condensation product prepared by condensation of 1 mol of 3-methoxy-diphenylamine-4-diazonium sulfate with 1 mol of 4-methyl-4'-methoxymethyl-diphenyl ether and then with 1 mol of 4,4'-bis-methoxymethyl-diphenyl ether in 85% phosphoric acid and isolated as the mesitylenesulfonate,
- 2.5 parts by weight of 2,5-dimethyl-hexane-2,5-dit.-butyl peroxide (INTEROX DHBP, from Peroxid-Chemie GmbH) as 45% granules with chalk,
- 2.1 parts by weight of phosphoric acid (85%),
- 1.5 parts by weight of crystal violet,
- 1.1 parts by weight of phenylazodiphenylamine in
- 1600 parts by weight of 2-methoxy-ethanol, and
- 350 parts by weight of butanone was applied to the support indicated in Example 1 to give a dry layer weight of 1.04 g/m$^2$.

After imagewise exposure and development with the developer solution described in Example 1, a copy with very high resolution and steep gradation was obtained. The printing form thus prepared was then heated for 3 minutes to 210° C. In the sheet offset press, markedly more than 280,000 qualitatively perfect prints were obtained.

EXAMPLE 7

The unexposed printing plates described in Example 6 were stored in a tropical cabinet at a relative humidity of 60% and a temperature of 42° C. for one, two, five, ten and twenty weeks, respectively. After they had been taken from the cabinet, the samples were in each case exposed and developed as in the preceding example. Even the plate that had been stored for twenty weeks in the tropical cabinet did not show any difference, either in the copy or in the print, as compared with the original plate of Example 6. It can be stated, therefore, that the storage life under tropical conditions was not restricted by the peroxide addition.

EXAMPLE 8

The unexposed printing plates described in Example 6 were stored for two, six, thirteen and twenty-six weeks, respectively, in a heating cabinet (hot box) which had a temperature of 56° C. When a plate was removed from the cabinet after each of these periods, the procedure described in Example 7 was followed. Again, it was found that the printing plate stored for twenty-six weeks did not show a significant difference, either in the copy or in the print, from the original plate of Example 6. Accordingly, it can be stated that elevated temperatures, such as can occasionally occur under improper storage conditions, did not lead to a noticeable restriction in the storage life.

EXAMPLE 9

In a comprehensive test, three coating solutions of the following composition were prepared:
- 62 parts by weight of the polymeric reaction product described in Example 1,
- 62 parts by weight of the diazonium salt polycondensation product described in Example 1,
- 3 parts by weight of one of the substances (a), (b) and (c) described below,
- 2.5 parts by weight of phosphoric acid (85%),
- 3 parts by weight of Victoria pure blue FGA, and
- 0.8 parts by weight of phenylazodiphenylamine in
- 3200 parts by weight of 2-methoxy-ethanol.

The substances to be defined in more detail are:
(a) ground chalk,
(b) n-butyl 4,4-bis-(t-butylperoxy)-valerate (INTEROX NBV-40-IC/G from Peroxid-Chemie GmbH) as 40% powder with chalk, and
(c) bis-(t-butylperoxy-isopropyl)-benzene (INTEROX DIPP 40-IC/G, from Peroxid-Chemie GmbH) as a 40% powder with chalk.

The solutions were applied to aluminum plates which had been electrolytically roughened with nitric acid, anodized and post-treated with polyvinylphosphonic acid, to give a dry layer weight of 1.0 g/m$^2$.

Five plates were prepared of each type as described below. These were exposed and developed, respectively, as described in Example 1 and then treated with a burn-in gumming. The types of plates were:
(1) not recured,
(2) heated for 5 minutes to 150° C.,
(3) heated for 5 minutes to 180° C.,
(4) heated for 5 minutes to 210° C., and
(5) heated for 5 minutes to 240° C.

For each type, three of the plates (a), (b) and (c), which had undergone the same thermal post-treatment were clamped into a printing press with extremely high contact pressure. The following results were obtained:
(1) The print runs of (a), (b) and (c) were virtually identical.
(2) The print runs of (a) and (c) were within the range of Test 1; type (b) did not show any damage at the same length of run.
(3) The print run of (a) was about 15% longer than in Test 1; types (b) and (c) did not show any detectable damage at this length of the run.
(4) The print run of (a) was about 15% longer than in Test 1; (b) and (c) did not show any damage even after a 50% longer print run.
(5) The print run of (a) fell slightly as compared with Test 1, types (b) and (c) had not suffered damage even after a 50% longer run.

This example shows that the abrasion resistance of light-sensitive layers containing diazonium salt polycondensation products, but lacking the addition of suitable crosslinking agents, could be only slightly improved by thermal post-curing. An actual reduction in the print run was found at high temperatures for the layers without peroxide. By contrast, the printing plates containing peroxide—depending on the type of chosen peroxide—could be burned in even at lower temperatures and with a higher efficiency. This suitability for burning-in was ensured even at higher temperatures.

What is claimed is:
1. A light-sensitive mixture consisting essentially of a light-sensitive diazonium salt polycondensation product in an amount sufficient to insolubilize the mixture in an aqueous-alkaline developer solution on exposure to actinic light which polycondensation product comprises recurrent units A—N₂X and B which are linked together by bridge members derived from carbonyl compounds capable of condensation, A being the radical of an aromatic diazonium compound capable of condensation with formaldehyde and B being the radical of a compound that is free of diazonium groups and that is capable of condensation with formaldehyde, a polymeric binder comprising a sufficient number of active hydrogen atoms which can be removed by a free radical mechanism and which is a reaction product of (a) an intramolecular anhydride of an organic polycarboxylic acid with (b) a synthetic polymer that comprises hydroxyl groups but no other functional groups capable of reaction with acid anhydrides and is present in an amount sufficient to make the mixture soluble in an aqueous-alkaline developer solution and to make the exposed mixture resistant to the stresses of high run lithographic printing, and from 0.1 to 15% by weight, relative to the non-volatile constituents of the mixture, and a crosslinking compound which can be activated thermally, wherein the crosslinking compound is an organic peroxide that has a scorch temperature of at least 100° C. and, above said scorch temperature, is capable of forming free radicals and is a compound represented by one of the following formulas:

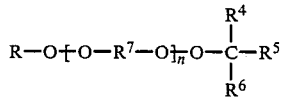   (I)

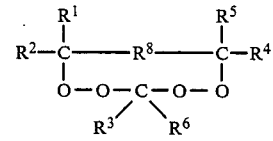   (II)

in which
R is an acyl group or a group

R¹ to R⁶ are identical or different alkyl, alkenyl, cycloalkyl, aralkyl or aryl radicals,
R⁷ is an alkylene, cycloalkylene, alkenylene, alkynylene, aralkylene or arylene group,
R⁸ is a single bond or an alkylene group, and
n is 0 or 1.

2. A light-sensitive mixture as claimed in claim 1, wherein any two of radicals R¹ to R⁶ that are substituted on one carbon atom are linked to form a cycloalkylene group.

3. A light-sensitive mixture as claimed in claim 1, wherein the carbon atoms of R⁷ to which peroxy groups of said organic peroxide are bonded are tertiary aliphatic carbon atoms.

4. A light-sensitive mixture as claimed in in claim 1, wherein the radicals R¹, R², R⁴ and R⁵ are alkyl groups having 1 to 4 carbon atoms.

5. A light-sensitive mixture as claimed in claim 1, wherein the polymeric binder is insoluble in water.

6. A light-sensitive mixture as claimed in claim 1, wherein the synthetic polymer is a polyvinyl acetal or polyvinyl acetate having free hydroxyl groups.

7. A light-sensitive mixture as claimed in claim 1, wherein the organic polycarboxylic acid is a dicarboxylic or tricarboxylic acid.

8. A light-sensitive mixture as claimed in claim 1, wherein said bridge members are methylene groups.

9. A light-sensitive mixture as claimed in claim 1, wherein B is a radical of a compound selected from the group consisting of an aromatic amine, phenol, phenol ether, an aromatic thioether, an aromatic hydrocarbon, an aromatic heterocyclic compound and an organic acid amide.

10. A light-sensitive mixture as claimed in claim 1, where the diazonium salt polycondensation product is present in an amount ranging from about 5% to 80% by weight, the polymeric binder is present in an amount ranging from about 20% to 95% by weight.

11. A light-sensitive recording material comprised of a support and a light-sensitive layer applied to the support, said layer comprising a light-sensitive mixture as claimed in claim 1.

* * * * *